United States Patent
Shibata

(10) Patent No.: US 9,599,305 B2
(45) Date of Patent: Mar. 21, 2017

(54) SEMICONDUCTOR LIGHT-EMITTING DEVICE HAVING MATRIX-ARRANGED LIGHT-EMITTING ELEMENTS

(71) Applicant: STANLEY ELECTRIC CO., LTD., Meguro-ku, Tokyo (JP)

(72) Inventor: Yasuyuki Shibata, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 26 days.

(21) Appl. No.: 14/645,316

(22) Filed: Mar. 11, 2015

(65) Prior Publication Data

US 2015/0262978 A1    Sep. 17, 2015

(30) Foreign Application Priority Data

Mar. 12, 2014    (JP) .................................. 2014-049183

(51) Int. Cl.
  *H01L 27/15*    (2006.01)
  *F21S 8/10*    (2006.01)

(52) U.S. Cl.
  CPC ....... *F21S 48/1747* (2013.01); *F21S 48/1154* (2013.01)

(58) Field of Classification Search
  CPC ... H01L 25/075; H01L 25/0753; H01L 25/13; H01L 27/15; H01L 27/153; H01L 27/156
  See application file for complete search history.

(56) References Cited

U.S. PATENT DOCUMENTS

2014/0110738 A1*  4/2014  Yokobayashi .......... H01L 33/44
                                                                    257/98
2014/0231842 A1*  8/2014  Akimoto ............... H01L 33/507
                                                                    257/98
2015/0316215 A1* 11/2015  Togawa .............. H01L 25/0753
                                                                   362/231

FOREIGN PATENT DOCUMENTS

JP         2013054849 A      3/2013
JP         2013054956 A      3/2013

* cited by examiner

*Primary Examiner* — Jae Lee
(74) *Attorney, Agent, or Firm* — Holtz, Holtz & Volek PC

(57) ABSTRACT

In a semiconductor light-emitting device including a semiconductor body including light-emitting elements arranged in a matrix, and a support body adapted to support the semiconductor body, the semiconductor body further includes a plurality of optical shield layers each provided at one of a first side face of a first one of the light-emitting elements and a second side face of a second one of the light-emitting elements opposing the first side face of the first light-emitting element.

7 Claims, 16 Drawing Sheets

SEMICONDUCTOR LIGHT-EMITTING DEVICE HAVING MATRIX-ARRANGED LIGHT-EMITTING ELEMENTS

This application claims the priority benefit under 35 U.S.C. §119 to Japanese Patent Application No. JP2014-049183 filed on Mar. 12, 2014, which disclosure is hereby incorporated in its entirety by reference.

BACKGROUND

Field

The presently disclosed subject matter relates to a semiconductor light-emitting device having a plurality of light-emitting elements such as light-emitting diode (LED) elements arranged in a matrix.

Description of the Related Art

A prior art semiconductor light-emitting device formed by LED elements arranged in a matrix including rows and columns has been used as a vehicle headlamp. In such a semiconductor light-emitting device, luminous intensities of the LED elements are individually controlled in real time to realize an adaptive drive beam (ADB) and an adaptive front-lighting system (AFS) (see: JP2013-54849A & JP2013-54956A).

In an ADB control, when a preceding vehicle including an on-coming vehicle is detected by a radar unit or the like, the luminous intensities of only the LED elements against the preceding vehicle are decreased to decrease the illuminance against the preceding vehicle while a high-beam mode is maintained. As a result, glaring against the preceding vehicle can be suppressed while the visibility in a high-beam mode can be maintained except for the preceding vehicle.

In an AFS control, when a steering angle read from a steering angle sensor or the like is larger than a predetermined value, the LED elements having high luminous intensities are shifted from a central area of the device to a right side or a left side of the device, to substantially decline the optical axis of the device while the visibility in a high-beam mode is maintained.

FIG. 1A is a plan view illustrating the above-mentioned prior art semiconductor light-emitting device, and FIG. 1B is a cross-sectional view taken along the line B-B in FIG. 1A. As illustrated in FIGS. 1A and 1B, the semiconductor light-emitting device includes a semiconductor wafer (body) 1 in which blue LED elements $D_{11}, D_{12}, \ldots, D_{33}$ in three rows, three columns are formed and a phosphor layer P1 including yitrium aluminium garnet (YAG) particles P10 for wavelength-converting blue light into yellow light to form white light is formed on the LED elements $D_{11}, D_{12}, \ldots, D_{33}$, and a support body 2 for supporting the semiconductor body 1. In this case, the semiconductor body 1 is wafer-bonded onto the support body 2. In FIG. 1B, each of the LED elements $D_{11}, D_{12}, \ldots, D_{33}$ are mesa-shaped, so that the distance between side faces of two adjacent LED elements is gradually decreased toward the support body 2.

Note that each of the LED elements $D_{11}, D_{12}, \ldots, D_{33}$ is square or rectangular viewed from the top, so that the LED elements $D_{11}, D_{12}, \ldots, D_{33}$ can be in close proximity to each other.

In the semiconductor light-emitting device of FIGS. 1A and 1B, since there are still relatively large spaces between the LED elements $D_{11}, D_{12}, \ldots, D_{33}$, even when the LED elements $D_{11}, D_{12}, \ldots, D_{33}$ are operated to emit lights $L_{11}, L_{12}, \ldots, L_{33}$, respectively, as illustrated in FIG. 2A, dark regions DR would be created at the spaces. As a result, as illustrated in FIG. 2B, light emitting regions $ER_{22}$ and $ER_{23}$ of the LED elements $D_{22}$ and $D_{23}$ would be decreased. In this case, the larger the spacing between the LED elements $D_{11}, D_{12}, \ldots, D_{33}$, the larger the dark regions DR.

On the other hand, when the LED elements $D_{11}, D_{12}, \ldots, D_{33}$ are closer to each other as illustrated in FIGS. 3A and 3B, the dark regions DR would be reduced in size to increase the light emitting regions. In this case, however, when the LED elements $D_{11}, D_{12}, D_{13}, D_{21}, D_{23}, D_{31}, D_{32}, D_{33}$ except for the LED element $D_{22}$ are operated to emit lights $L_{11}, L_{12}, L_{13}, L_{21}, L_{23}, L_{31}, L_{32}, L_{33}$, leakage lights LL would be leaked into the non-operated LED element $D_{22}$ from its adjacent operated LED elements. Therefore, weak light would be emitted from the non-operated LED element $D_{22}$, so that optical crosstalk would be generated between the non-operated LED element and its adjacent operated LED elements.

Thus, in the semiconductor light-emitting device of FIGS. 1A and 1B, it is preferable that both of the dark regions DR and the optical crosstalk be as small as possible; however, there is a trade-off relationship between the dark regions DR and the optical crosstalk.

SUMMARY

The presently disclosed subject matter seeks to solve one or more of the above-described problems.

According to the presently disclosed subject matter, in a semiconductor light-emitting device including a semiconductor body including light-emitting elements arranged in a matrix, and a support body adapted to support the semiconductor body, the semiconductor body further includes a plurality of optical shield layers each provided at one of a first side face of a first one of the light-emitting elements and a second side face of a second one of the light-emitting elements opposing the first side face of the first light-emitting element.

Thus, according to the presently disclosed subject matter, the dark regions between the light-emitting elements can be decreased or suppressed, while no optical crosstalk between the light-emitting elements is generated regardless of the distance between the light-emitting elements.

BRIEF DESCRIPTION OF THE DRAWINGS

The above and other advantages and features of the presently disclosed subject matter will be more apparent from the following description of certain embodiments, as compared with the prior art, taken in conjunction with the accompanying drawings, wherein.

DETAILED DESCRIPTION OF EXEMPLARY EMBODIMENTS

Figure 1A:
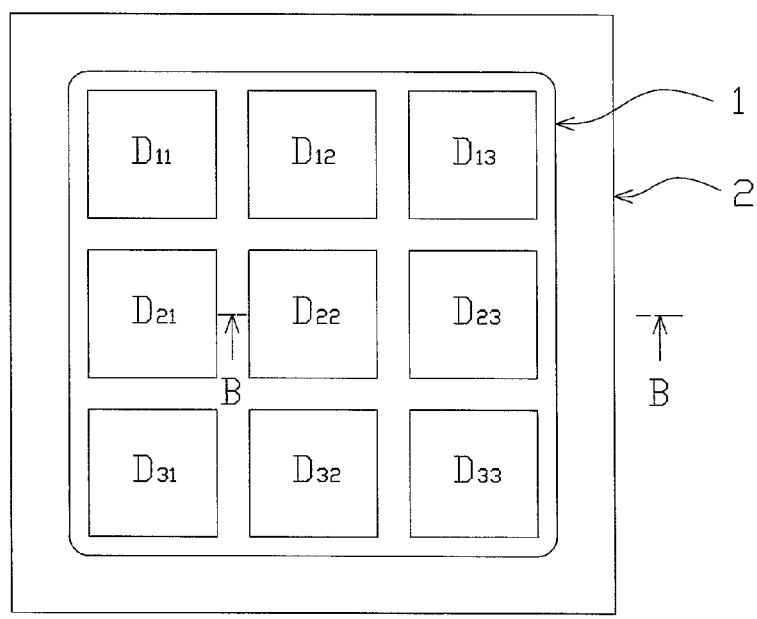
FIG. 1A is a plan view illustrating a prior art semiconductor light-emitting device.
Figure 1B:
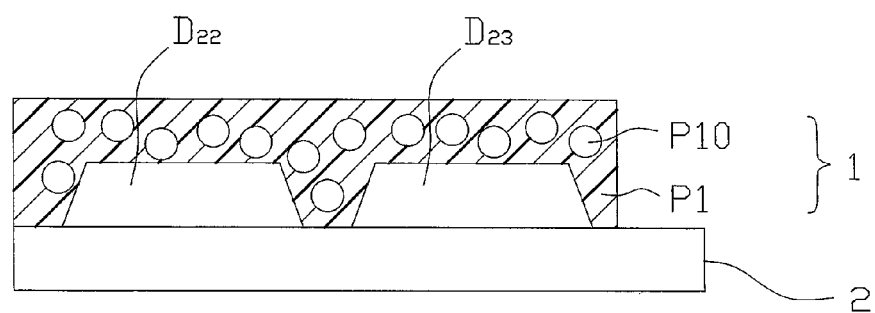
FIG. 1B is a cross-sectional view taken along the line B-B in FIG. 1A.
Figure 2A:
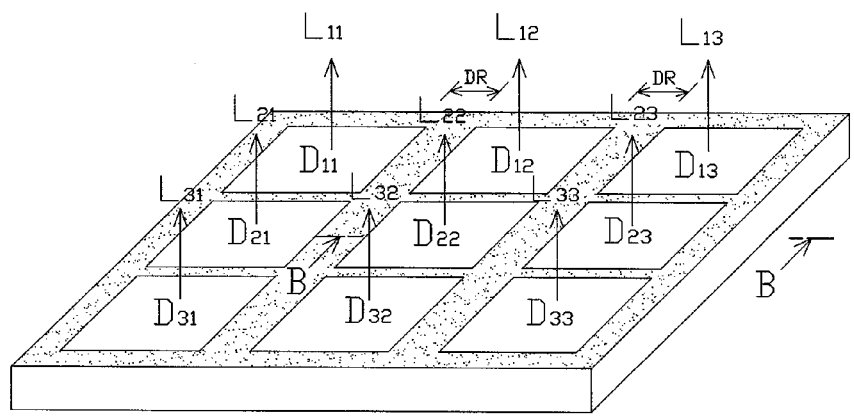
FIG. 2A is a perspective view of the semiconductor light-emitting device of FIG. 1A for explaining the dark regions.
Figure 2B:
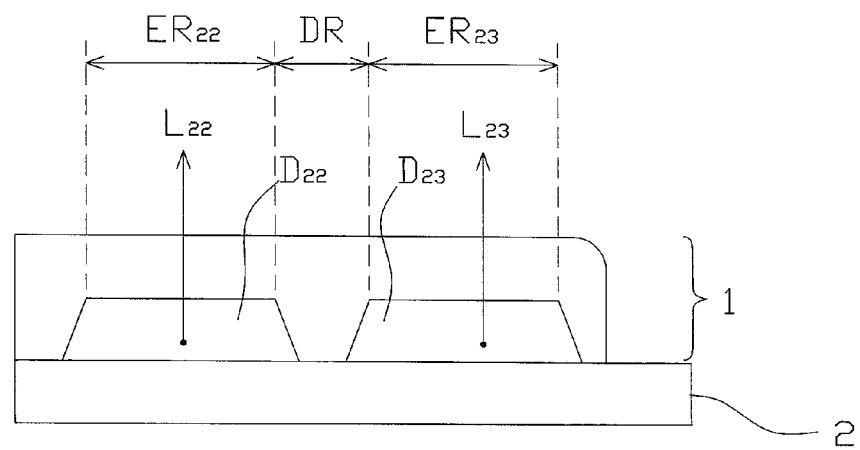
FIG. 2B is a cross-sectional view taken along the line B-B in FIG. 2A.
Figure 3A:
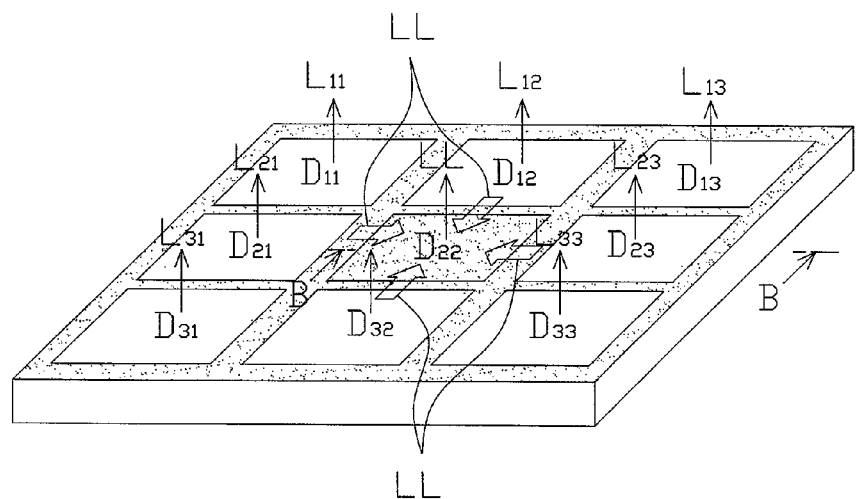
FIG. 3A is a perspective view of the semiconductor light-emitting device of FIG. 1A for explaining the optical crosstalk.
Figure 3B:
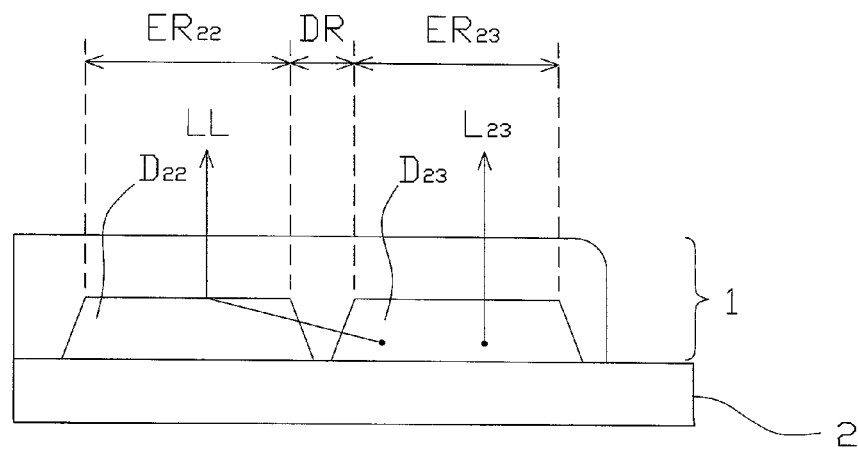
FIG. 3B is a cross-sectional view taken along the line B-B in FIG. 3A.
Figure 4A:
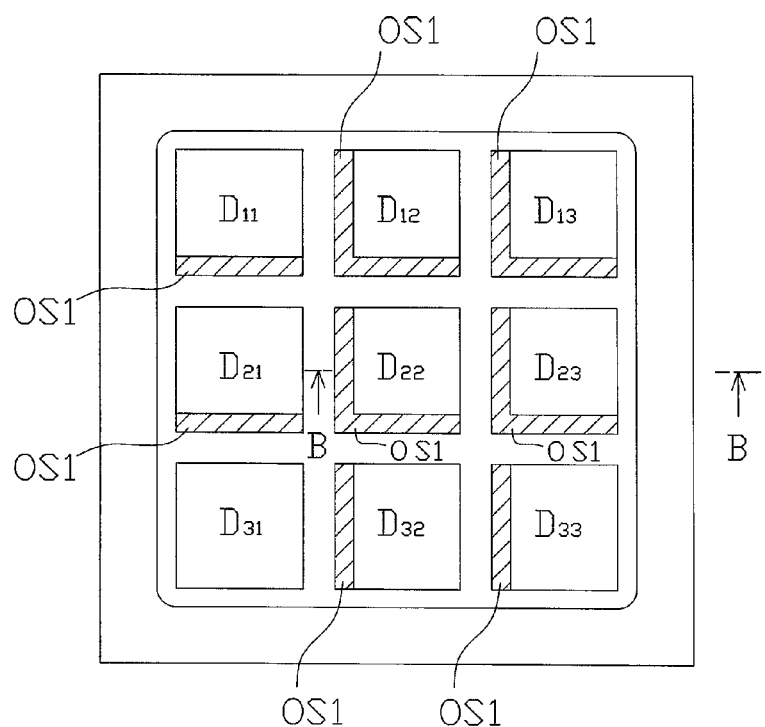
FIG. 4A is a plan view illustrating a first embodiment of the semiconductor light-emitting device according to the presently disclosed subject matter.
Figure 4B:
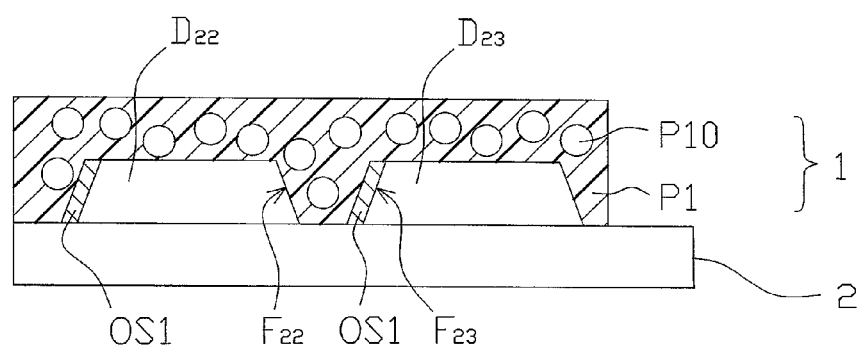
FIG. 4B is a cross-sectional view taken along the line B-B in FIG. 4A.

FIG. 4A illustrates a first embodiment of the semiconductor light-emitting device according to the presently disclosed subject matter, and FIG. 4B is a cross-sectional view taken along the line B-B in FIG. 4A.

In FIGS. 4A and 4B, one optical shield layer OS1 is formed on one of a slant side face of one LED element and a slant side face of its adjacent LED element opposing the slant side face of the one LED element. For example, as illustrated in FIG. 4B, the LED element $D_{22}$ is adjacent to the LED element $D_{23}$, and a slant side face $F_{22}$ of the LED element $D_{22}$ opposes a slant side face $F_{23}$ of the LED element $D_{23}$. In this case, one optical shield layer OS1 is formed on either the side face $F_{22}$ of the LED element $D_{22}$ or the side face $F_{23}$ of the LED element $D_{23}$.

The optical shield layer OS1 is made of metal such as Ag, Pt, Al, Rh or Ti for shielding the LED elements from visible light of their adjacent LED elements. The optical shield layer OS1 is reflective or absorptive; however, the optical shield layer OS1 is not completely reflective or not completely absorptive.

Figure 5:
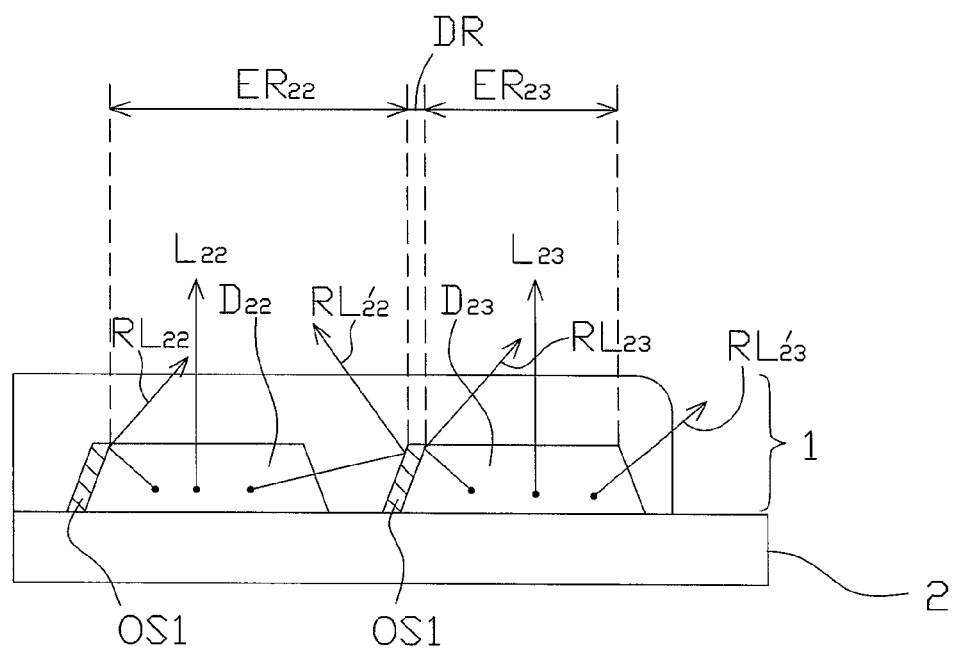
FIG. 5 is a cross-sectional view taken along the line B-B in FIG. 4A for explaining the dark region and the optical crosstalk when the optical shield layer is reflective.

As illustrated in FIG. 5, if the optical shield layers OS1 are completely reflective, since lights $RL_{22}$ and $RL_{22'}$ from the LED element $D_{22}$ are totally reflected by the optical shield layers OS1, the lights $RL_{22}$ and $RL_{22'}$ would be emitted along with the light $L_{22}$. Also, since light $RL_{23}$ from the LED element $D_{23}$ is totally reflected by the optical shield layer OS1, the light $RL_{23}$ would be emitted along with the light $L_{23}$. In this case, however, light $RL_{23'}$ from the LED element $D_{23}$ may be leaked therefrom. Therefore, the dark region DR between the LED element elements $D_{22}$ and $D_{23}$ determined by the optical shield layer OS1 is decreased, so that the light emitting regions $ER_{22}$ and $ER_{23}$ of the LED elements $D_{22}$ and $D_{23}$ are increased. Also, no optical crosstalk between the light emitting regions $ER_{22}$ and $ER_{23}$ is generated regardless of the distance between the LED elements $D_{22}$ and $D_{23}$.

Figure 6A:
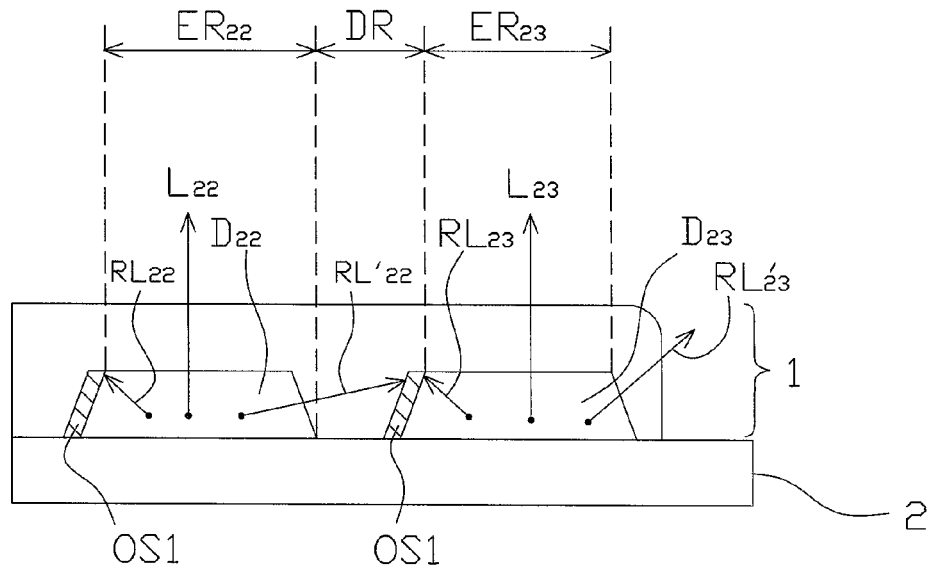
FIGS. 6A and 6B are cross-sectional views taken along the line B-B in FIG. 4A for explaining the dark region and the optical crosstalk when the optical shield layer is absorptive.

As illustrated in FIG. 6A, if the optical shield layers OS1 are completely absorptive, lights $RL_{22}$ and $RL_{22'}$ from the LED element $D_{22}$ are completely absorbed by the optical shield layers OS1, and also, light $RL_{23}$ from the LED element $D_{23}$ is completely absorbed by the optical shield layer OS1. In this case, however, light $RL_{23'}$ from the LED element $D_{23'}$ still may be leaked therefrom. Therefore, although the dark region DR between the LED elements $D_{22}$ and $D_{23}$ is not decreased, so that the light emitting regions $ER_{22}$ and $ER_{23}$ of the LED elements $D_{22}$ and $D_{23}$ are not increased, no optical crosstalk between the light emitting regions $ER_{22}$ and $ER_{23}$ is generated.

Figure 6B:
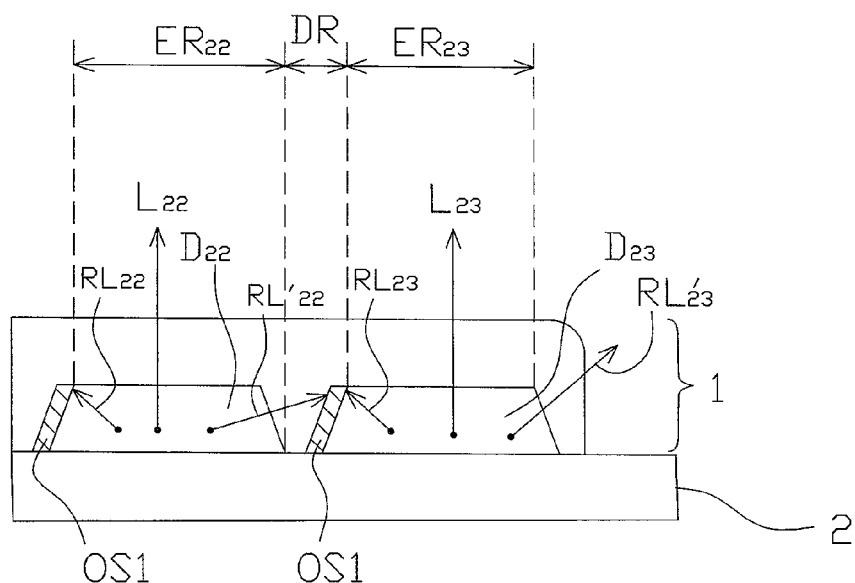

On the other hand, in order to increase the light emitting regions $ER_{22}$ and $ER_{23}$ of FIG. 6A, the LED elements $D_{22}$ and $D_{23}$ can be closer to each other as illustrated in FIG. 6B. In this case, the dark region DR between the LED elements $D_{22}$ and $D_{23}$ determined by the spacing therebetween can be decreased or suppressed to increase the light emitting regions $ER_{22}$ and $ER_{23}$, while no optical crosstalk between the light emitting regions $ER_{22}$ and $ER_{23}$ is generated.

Thus, in the semiconductor light-emitting device of FIGS. 4A and 4B, the dark regions DR can be decreased or suppressed, while no optical crosstalk between the LED elements is generated.

Figure 7:
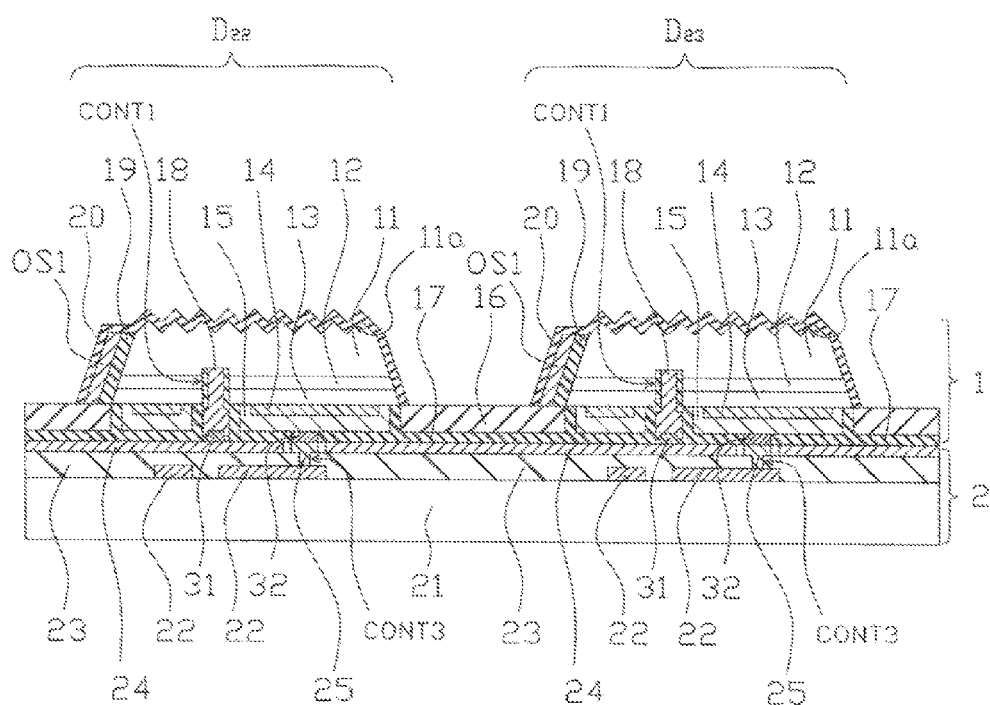
FIG. 7 is a detailed cross-sectional view of the semiconductor light-emitting device of FIG. 4B.

FIG. 7 is a detailed cross-sectional view of the semiconductor light-emitting device of FIG. 4B. In FIG. 7, the phosphor layer P1 is omitted to simplify the description.

The semiconductor body 1 includes an n-type AlInGaN layer 11, an active AlInGaN layer 12 and a p-type AlInGaN layer 13, which are represented by $Al_xIn_yGa_{1-x-y}N$ ($0 \leq x \leq 1$, $0 \leq y \leq 1$).

A reflective layer 14 made of metal such as Ag, Pt, Ni, Al, Pd or their alloy having good ohmic contact characteristics with the p-type AlInGaN layer 13 is formed on the p-type AlInGaN layer 13, and a cap layer 15 made of refractory metal such as Ti, Pd, Mo, Ru or Ir or noble metal such as Pt or Au is formed to cover the reflective layer 14. The cap layer 15 is hardly migrated to avoid the migration of the reflective layer 14. The reflective layer 14 and the cap layer 15 serve as a p-side electrode. Note that a metal oxide layer made of indium tin oxide (ITO) or indium zinc oxide (IZO) can be inserted between the p-type AlInGaN layer 13 and the reflective layer 14 to enhance the reflectivity.

An etching adjustment layer 16 made of insulating material such as silicon dioxide or silicon nitride is provided for isolating the LED elements $D_{22}$ and $D_{23}$ from each other. The etching adjustment layer 16 serves as an etching stopper as well as a protecting layer for wiring layers of the support body 2.

An insulating layer 17 made of silicon dioxide or silicon nitride is formed on the entire surface. In this case, a contact hole CONT1 is perforated in the p-type AlInGaN layer 13 and the active AlInGaN layer 12 to reach the n-type AlInGaN layer 11 before the formation of the insulating layer 17.

An n-side electrode 18 made of metal such as Ti, Al, Pt or Au having good ohmic contact characteristics with the n-type AlInGaN layer 11 is formed in the contact hole CONT1 to reach the n-type AlInGaN layer 11.

The n-type AlInGaN layer 11 has a protruded light extracting surface 11a to suppress the total internal reflection component and the Fresnel component, thus improving the light extracting efficiency.

An insulating layer 19 made of silicon dioxide or silicon nitride is formed on a side face of the n-type AlInGaN layer 11, the active AlInGaN layer 12 and the p-type AlInGaN layer 13. Also, an optical shield layer OS1 is formed on the insulating layer 19. Further, a protection layer 20 made of silicon dioxide is formed on the n-type AlInGaN layer 11 and the optical shield layer OS1.

On the other hand, the support body 2 includes a support substrate 21 made of heat dissipating material such as Si, AlN, Mo, W or CuW, p-side wiring layers 22 formed on the support substrate 21, an insulating layer 23 made of silicon dioxide or the like formed on the p-side wiring layers 22, an n-side wiring layer 24 formed on the insulating layer 23, and a p-side electrode 25 formed in a contact hole CONT3 of the insulating layer 23 to reach one of the p-side wiring layers 22.

The semiconductor body 1 is wafer-bonded onto the support body 2, so that the n-side electrode 18 is bonded to the n-side wiring layer 24 by a bonding layer 31, and the cap layer 15 coupled to the p-type AlInGaN layer 13 is bonded to the p-side electrode 25 by a bonding layer 32.

The LED elements are provided at intersections between the p-side wiring layers 22 and the n-side wiring layers 24 which are isolated by the insulating layer 23. Therefore, the LED elements are operated individually in real time by supplying voltages to the p-side wiring layers 22 and the n-side wiring layer 24.

A method for manufacturing the semiconductor light-emitting device will now be explained with reference to FIGS. 8 and 9.

Figure 8:
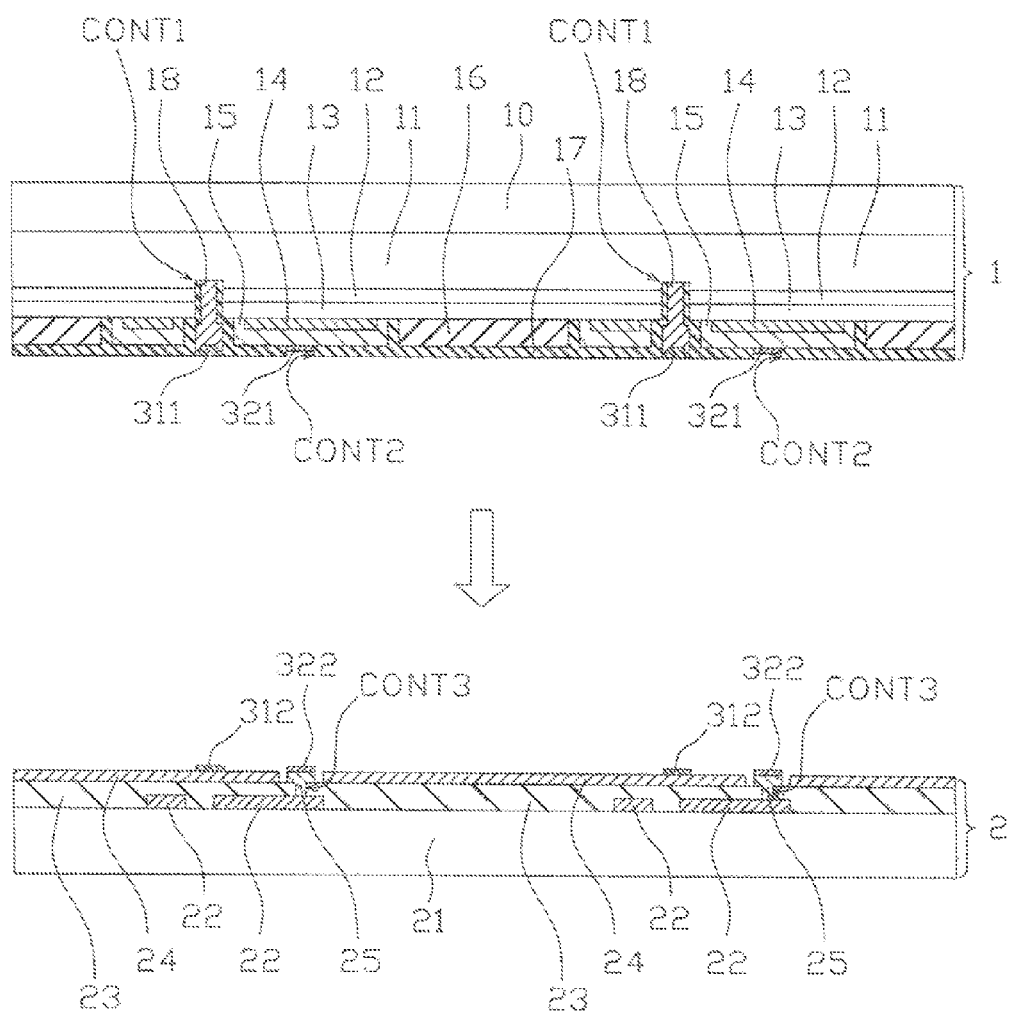
FIGS. 8 and 9 are cross-sectional views for explaining a method for manufacturing the semiconductor light-emitting device of FIG. 7.

First, referring to FIG. 8, a growing sapphire substrate 10 is prepared. Then, an n-type AlInGaN layer 11, an active AlInGaN layer 12 and a p-type AlInGaN layer 13 are sequentially and epitaxially grown on the growing sapphire substrate 10 by a metal organic chemical vapor deposition (MOCVD) process. In this case, the active AlInGaN layer 12 can be of a multiple quantum well (MQW) structure, of a single quantum well (SQW) structure or of a single layer.

Next, a reflective layer 14 and a cap layer 15 are formed on the p-type AlInGaN layer 13 by a sputtering process or the like, and are patterned by a photolithography/etching process.

Next, an etching adjustment layer 16 is formed by a sputtering process or the like, and is patterned by a photolithography/etching process.

Next, a contact hole CONT1 is perforated in the p-type AlInGaN layer 13 and the active AlInGaN layer 12 to reach the n-type AlInGaN layer 11.

Next, an insulating layer 17 is formed on the entire surface including the sidewall of the contact hole CONT1 by a CVD process or the like. Then, a photolithography/etching process is performed upon the insulating layer 17 to expose the bottom of the contact hole CONT1 and form a contact hole CONT2 in the insulating layer 17 opposing the cap layer 15.

Next, an n-side electrode 18 is formed in the contact hole CONT1 by a sputtering process or the like and a photolithography/etching process.

Next, an adhesive layer 311 including Au on its upper surface portion is formed on the n-side electrode 18. The adhesive layer 311 is used for the bonding layer 31 of FIG. 7. Also, an adhesive layer 321 including Au on its upper surface portion is formed on the cap layer 15. The adhesive layer 321 is used for the bonding layer 32 of FIG. 7.

On the other hand, a support substrate 21 is prepared. Then, p-side wiring layers 22 are formed by a sputtering processor the like and a photolithography/etching process on the support substrate 21.

Next, an insulating layer 23 is formed by a CVD process on the p-side wiring layers 22.

Next, a contact hole CONT3 is perforated by a photolithography/etching process in the insulating layer 23.

Next, a p-side electrode 25 is formed by a sputtering process and the like and a photolithography/etching process in the contact hole CONT3 of the insulating layer 23.

Next, an adhesive layer 312 including Au on its upper surface portion is formed on the n-side wiring layer 24. The adhesive layer 312 is used for the bonding layer 31 of FIG. 7. Also, an adhesive layer 322 including Au on its upper surface portion is formed on the p-side electrode 25. The adhesive layer 322 is used for the bonding layer 32 of FIG. 7.

Figure 9:
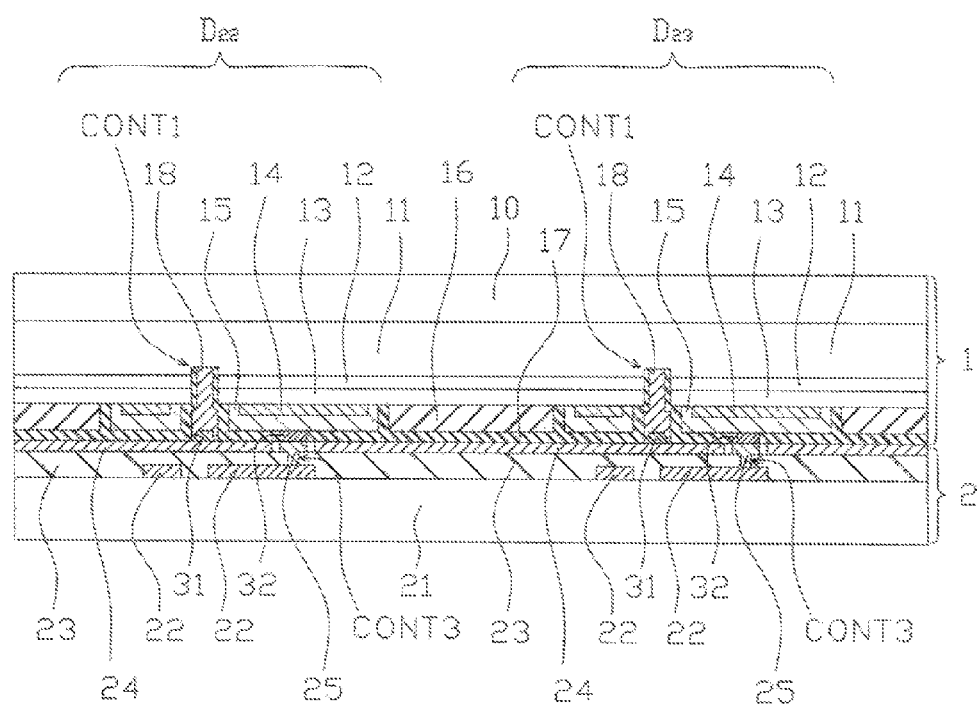

Next, the semiconductor body 1 is bonded by a thermal pressurizing process onto the support body 2, thus obtaining a semiconductor light-emitting device as illustrated in FIG. 9. As a result, the adhesive layers 311 and 312 are combined into a bonding layer 31, and the adhesive layers 321 and 322 are combined into a bonding layer 32. In this case, if a material such as Au at the upper surface portion of the adhesive layer 311 is different from a material such as Sn of the adhesive layer 312, the bonding layer 31 is an AuSn eutectic alloy layer. Similarly, if a material such as Au at the upper surface portion of the adhesive layer 321 is different from a material such as Sn of the adhesive layer 322, the bonding layer 32 is an AuSn eutectic alloy layer.

Next, the growing sapphire substrate 10 is removed by a wet etching process or the like.

Next, the n-type AlInGaN layer 11, the active AlInGaN layer 12 and the p-type AlInGaN layer 13 are mesa-etched by a reactive ion etching (RIE) process using the etching adjustment layer 16 as an etching stopper.

Next, an insulating layer 19 is formed by a sputtering processor the like and a photolithography/etching process on a slant side face of the mesa-etched structure.

Next, an optical shield layer OS1 is formed by a lift-off process on the insulating layer 19. That is, a photolithography process is carried out to form a resist pattern on the insulating layer 19. Then, a metal layer such as Ag, Pt, Al, Rh or Ti is deposited by an electron beam (EB) evaporation process or a sputtering process on the entire surface. Then, the resist pattern is removed.

Next, the surface of the n-type AlInGaN layer 11 is etched by a dry etching and the like, so that the surface 11a of the n-type AlInGaN layer 11 is protruded.

Then, a protection layer 20 is formed by a sputtering process or the like on the entire surface.

Finally, the support body 2 is mounted on a mounting substrate (not shown), and necessary wires are bonded between the semiconductor light-emitting device and the mounting substrate. As occasion demands, the entirety of the semiconductor light-emitting device is resin-molded (not shown).

In FIG. 4A, no optical shield layers are provided at outermost side faces of the LED elements; however, such optical shield layers can be at the outermost side faces, to obtain a clearly illuminated image, as occasion demands.

Figure 10:
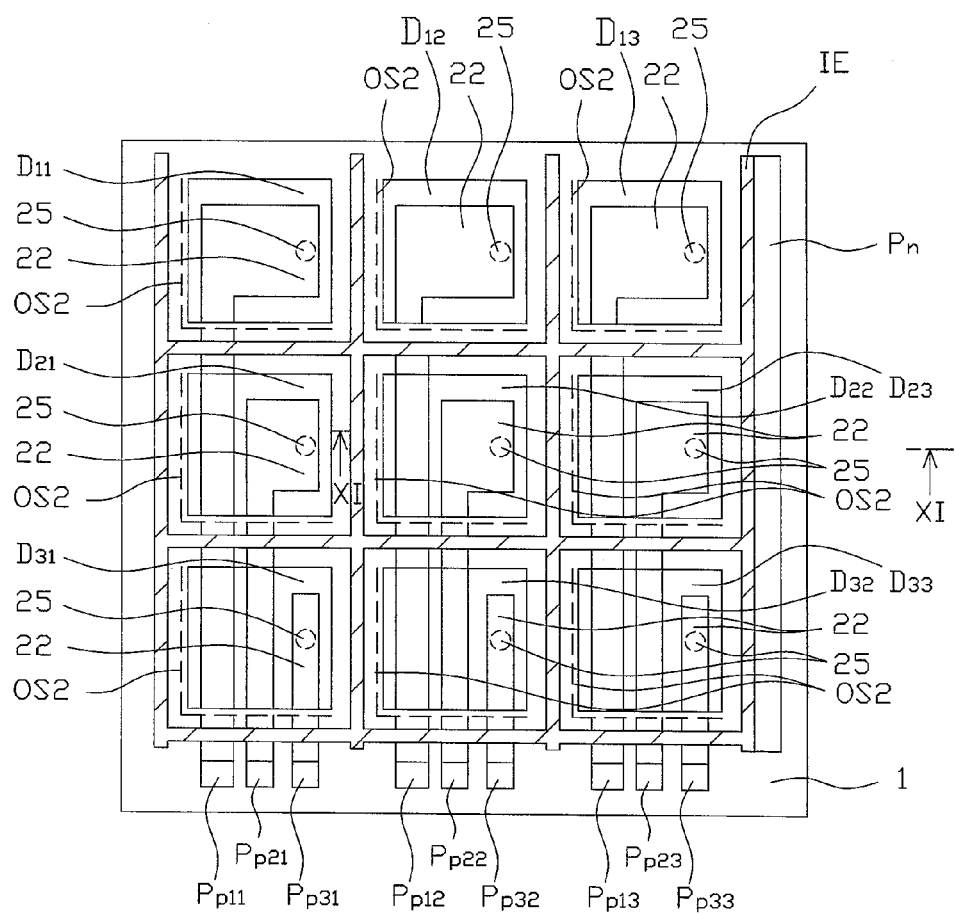
FIG. 10 is a plan view illustrating a second embodiment of the semiconductor light-emitting device according to the presently disclosed subject matter.
Figure 11:
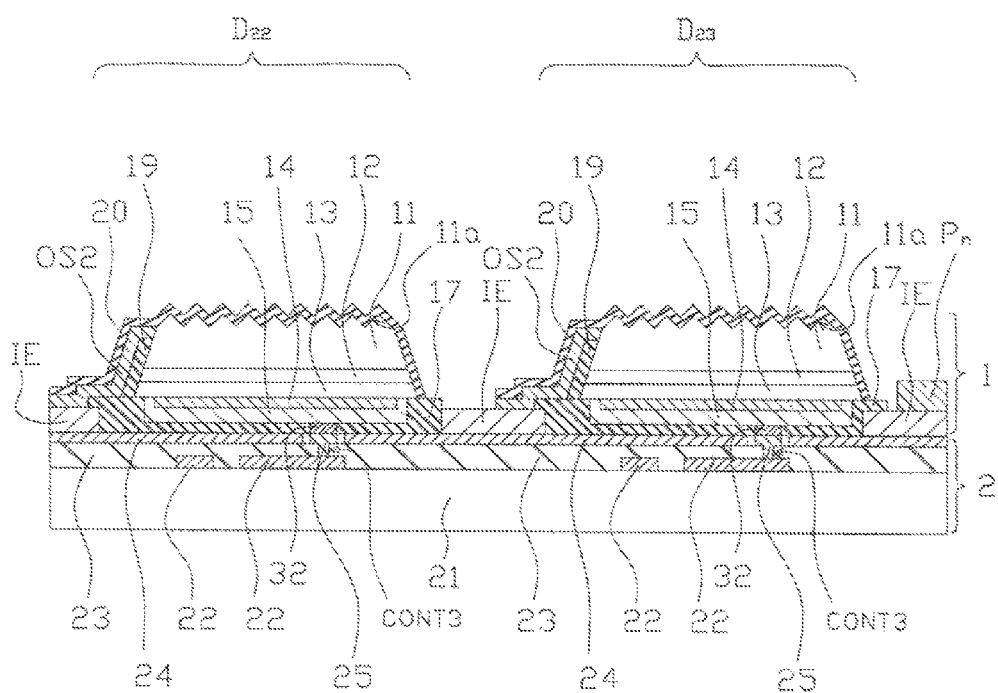
FIG. 11 is a cross-sectional view taken along the line XI-XI in FIG. 10.

In FIG. 10, which is a plan view illustrating a second embodiment of the semiconductor light-emitting device according to the presently disclosed subject matter, optical shield layers OS2, that are conductive, serve as n-side electrodes. That is, the optical shield layers OS2 are electrically connected to the n-type AlInGaN layer 11 (see: FIG. 11) of the LED elements $D_{11}, D_{12}, \ldots, D_{33}$, and also, are electrically connected via intermediate electrodes IE to an n-side pad $P_n$. Also, the p-side wiring layers 22 of the LED elements $D_{11}, D_{12}, \ldots, D_{33}$ are electrically connected to p-side pads $P_{p11}, P_{p12}, \ldots, P_{p33}$, respectively. Therefore, the LED elements $D_{11}, D_{12}, \ldots, D_{33}$ can be individually operated by supplying voltages to the n-side pad $P_n$ and the p-side pads $P_{p11}, P_{p12}, \ldots, P_{p33}$.

As illustrated in FIG. 11, which is a cross-sectional view taken along the line XI-XI in FIG. 10, since the optical shield layers OS2 serve as n-side electrodes, the n-side electrode 15 and the bonding layer 31 of FIG. 7 are not provided. However, the n-side electrode 15 and the bonding layer 31 can be provided; in this case, currents can also be supplied to the LED elements from the n-side electrode 18 of FIG. 7, so that, even when the area of each of the LED elements is large, the current flowing therethrough can be large, thus increasing the luminous intensities of the LED elements simultaneously with suppressing irregularity of the luminous intensity within the LED elements.

In FIG. 11, since the intermediate electrodes IE serve as the etching adjustment layers 16 of FIG. 7, the etching adjustment layers 16 are not provided.

The method for manufacturing the semiconductor light-emitting device of FIG. 10 is about the same as the method for manufacturing the semiconductor light-emitting device of FIG. 7, except for the following. Instead of the formation of the etching adjustment layers 16 of FIG. 7, the intermediate electrodes IE are formed by a sputtering process and the like and a photolithography/etching process in the insulating layer 17. Also, before the formation of the optical shield layers OS2, the insulating layer 19 is formed by a sputtering process or the like and a photolithography/etching process on only a part of the slant side face of the mesa-etched structure, so that the optical shield layers OS2 are electrically connected to the n-type AlInGaN layer 11.

Figure 12:
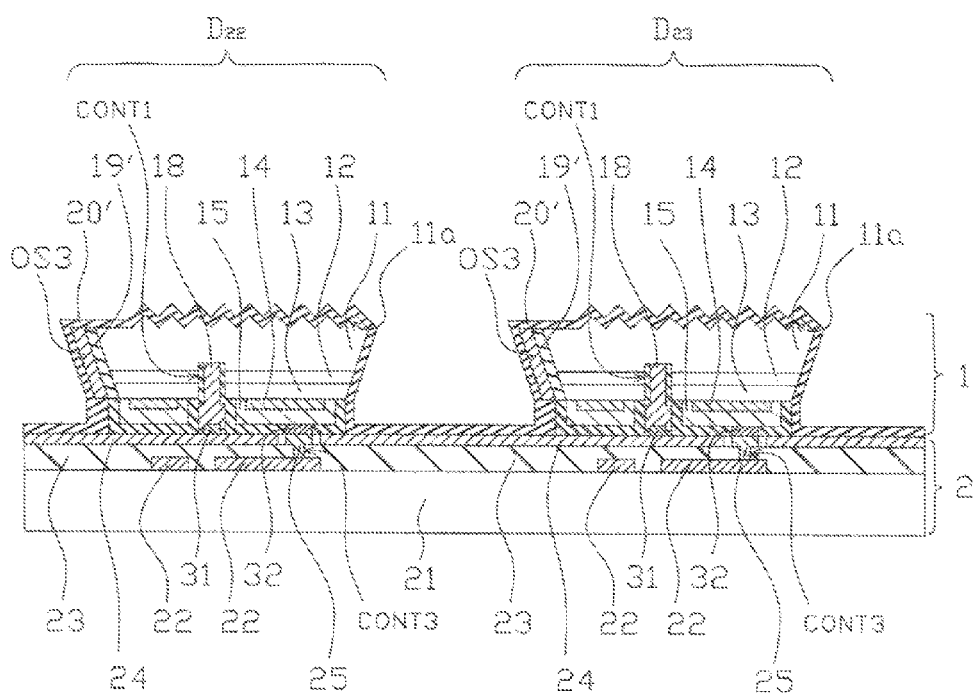
FIG. 12 is a cross-sectional view illustrating a third embodiment of the semiconductor light-emitting device according to the presently disclosed subject matter.

In FIG. 12, which is a cross-sectional view illustrating a third embodiment of the semiconductor light-emitting device according to the presently disclosed subject matter, each of the LED elements $D_{22}$ and $D_{23}$ are reversely mesa-shaped, so that the distance between side faces of two adjacent LED elements is increased toward the support body 2. Note that a plan view of the semiconductor light-emitting device of FIG. 12 is represented by FIG. 4A where the optical shield layer OS1 is replaced by the optical shield layer OS3. The optical shield layer OS3 is reflective or absorptive. Even in this case, the optical shield layer OS3 is not completely reflective and not completely absorptive.

Figure 13:
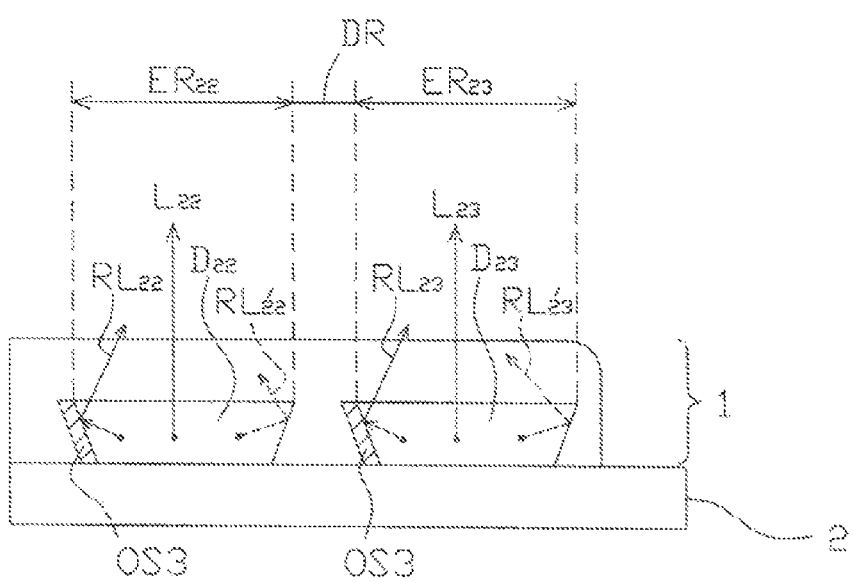
FIG. 13 is a cross-sectional view for explaining the dark region and the optical crosstalk in the semiconductor light-emitting device of FIG. 12 when the optical shield layer is reflective.

As illustrated in FIG. 13, if the optical shield layers OS3 are completely reflective, since light $RL_{22}$ from the LED element $D_{22}$ is totally reflected by the optical shield layer OS3 and light $RL_{22'}$ from the LED element $D_{22}$ is somewhat reflected by the slant side face of the LED element $D_{22}$ where the optical shield layer OS3 is not provided, the lights $RL_{22}$ and $RL_{22'}$ would be emitted along with the light $L_{22}$. Also, since light $RL_{23}$ from the LED element $D_{23}$ is totally reflected by the optical shield layer OS3 and light $RL_{23'}$ from the LED element $D_{23}$ is somewhat reflected by the slant side face of the LED element $D_{23}$ where the optical shield layer OS3 is not provided, the lights $RL_{23}$ and $RL_{23'}$ would be emitted along with the light $L_{23}$. Therefore, the dark region DR between the LED element $D_{22}$ and $D_{23}$ is not decreased, so that the light emitting regions $ER_{22}$ and $ER_{23}$ of the LED elements $D_{22}$ and $D_{23}$ are not increased. However, the LED elements $D_{22}$ and $D_{23}$ can be closer to each other to increase the light emitting regions $ER_{22}$ and $ER_{23}$. Also, no optical crosstalk between the light emitting regions $ER_{22}$ and $ER_{23}$ is generated regardless of the distance between the LED elements $D_{22}$ and $D_{23}$.

Figure 14:
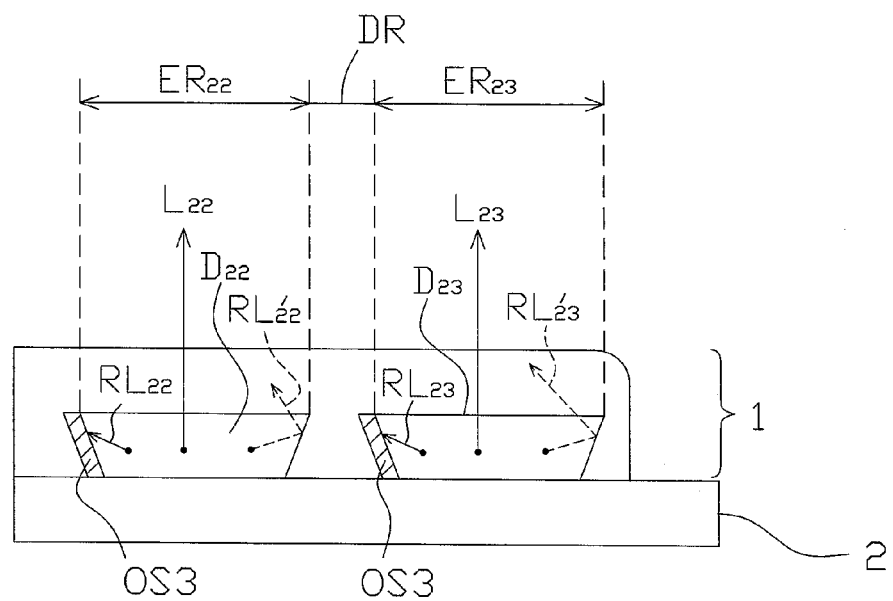
FIG. 14 is a cross-sectional view for explaining the dark region and the optical crosstalk in the semiconductor light-emitting device of FIG. 12 when the optical shield layer is absorptive.

As illustrated in FIG. 14, if the optical shield layers OS3 are completely absorptive, light $RL_{22}$ from the LED element $D_{22}$ is totally absorbed by the optical shield layers OS3 and light $RL_{22'}$ is somewhat reflected by the slant side face of the LED element $D_{23}$ where the optical shield layer OS3 is not provided. Also, light $RL_{23}$ from the LED element $D_{23}$ is totally absorbed by the optical shield layer OS3 and light $RL_{23'}$ is somewhat reflected by the slant side face of the LED element $D_{23}$ where the optical shield layer OS3 is not provided. Therefore, although the dark region DR between the LED element $D_{22}$ and $D_{23}$ is not decreased, so that the light emitting regions $ER_{22}$ and $ER_{23}$ of the LED elements $D_{22}$ and $D_{23}$ are not increased, no optical crosstalk between the light emitting regions $ER_{22}$ and $ER_{23}$ is generated. Even in this case, the LED elements $D_{22}$ and $D_{23}$ can be closer to each other to increase the light emitting regions $ER_{22}$ and $ER_{23}$.

Thus, in the semiconductor light-emitting device of FIG. 12, the dark regions between the LED elements can be decreased or suppressed, while no optical crosstalk between the LED elements is generated.

The method for manufacturing the semiconductor light-emitting device of FIG. 12 is about the same as the method for manufacturing the semiconductor light-emitting device of FIG. 7, except for the following. Before the wafer bonding by a thermal pressurizing process, the semiconductor body 1 is mesa-etched by a reactive ion etching (RIE) process using the growing sapphire substrate 10 as an etching stopper. As a result, the semiconductor structure formed by the n-type AlInGaN layer 11, the active AlInGaN layer 12 and the p-type AlInGaN layer 13 is mesa-shaped viewed from the growing sapphire substrate 10; in other words, this semiconductor structure is reversely mesa-shaped viewed from the support body 2.

Figure 15:
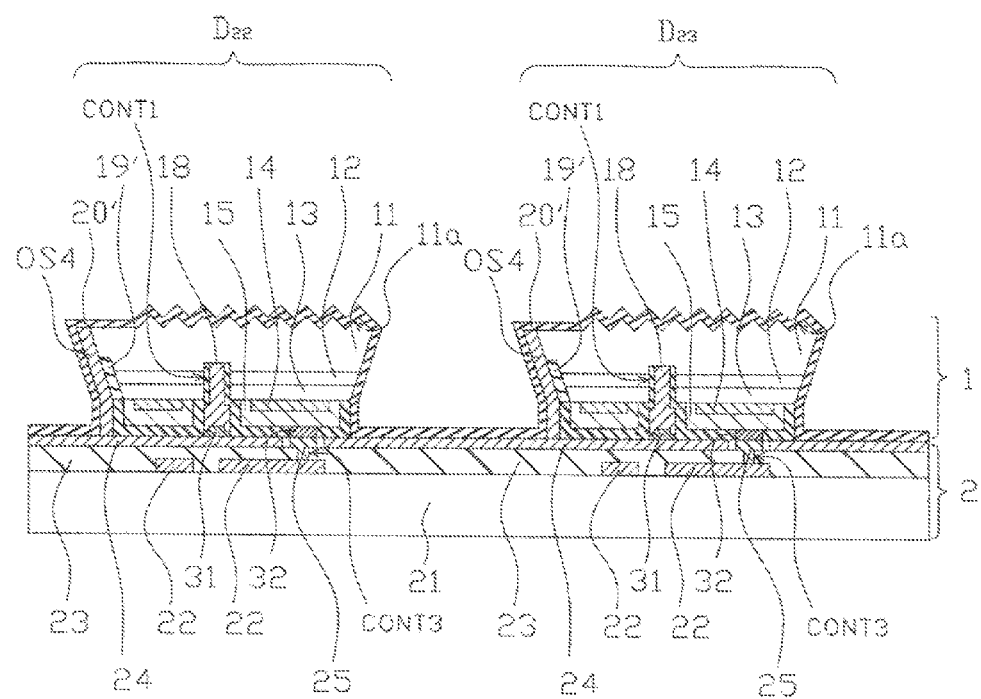
FIG. 15 is a cross-sectional view illustrating a fourth embodiment of the semiconductor light-emitting device according to the presently disclosed subject matter.

In FIG. 15, which is a cross-sectional view illustrating a fourth embodiment of the semiconductor light-emitting device according to the presently disclosed subject matter, each of the LED elements $D_{22}$ and $D_{23}$ are also reversely mesa-shaped, so that the distance between side faces of two adjacent LED elements is increased toward the support body 2. Note that a plan view of the semiconductor light-emitting device of FIG. 15 is represented by FIG. 10 where the optical shield layer OS2 is replaced by the optical shield layer OS4.

In FIG. 15, optical shield layers OS4, that are conductive, serve as n-side electrodes. That is, the optical shield layers OS4 are electrically connected to the n-type AlInGaN layer 11 of the LED element elements $D_{22}$ and $D_{23}$.

In FIG. 15, since the optical shield layers OS4 serve as n-side electrodes, the n-side electrode 15 and the bonding layer 31 of FIG. 7 can be omitted.

The method for manufacturing the semiconductor light-emitting device of FIG. 15 is about the same as the method for manufacturing the semiconductor light-emitting device of FIG. 12, except for the following. Before the formation of the optical shield layers OS4, the insulating layer 19' is formed by a sputtering process or the like and a photolithography/etching process on only a part of the slant side face of the reverse mesa-etched structure, so that the optical shield layers OS4 are electrically connected to the n-type AlInGaN layer 11.

Figure 16:
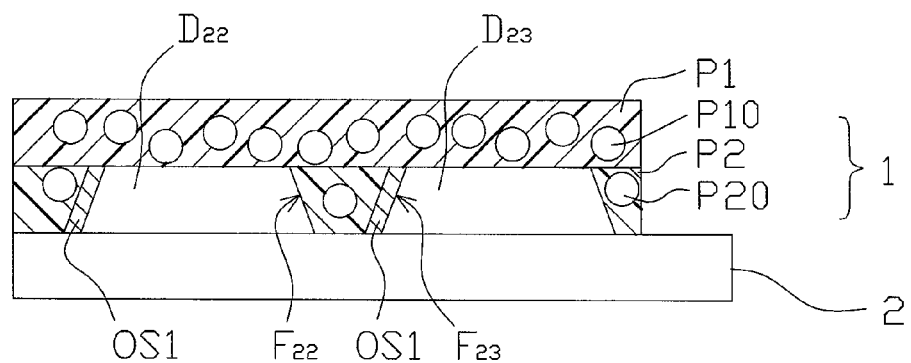
FIG. 16 is a cross-sectional view illustrating a modification of the semiconductor light-emitting device of FIG. 4B.

In FIG. 16, which is a cross-sectional view illustrating a modification of the semiconductor light-emitting device of FIG. 4B, a phosphor layer P2 made of silicone resin or the like including phosphor particles P20 different from the phosphor particles P10 is formed between the LED element elements $D_{22}$ and $D_{23}$. For example, the phosphor particles P20 wavelength convert blue light into green light. Also, the phosphor layer P1 including the phosphor particles P10 are formed on the LED element elements $D_{22}$ and $D_{23}$ and the phosphor layer P2.

In FIG. 4B, note that light emitted from the upper face of the LED elements $D_{22}$ and $D_{23}$ would be completely white; however, light emitted from the side faces of the LED elements $D_{22}$ and $D_{23}$ would be white with a yellow-tint due to the long length of optical path, thus creating the color drift.

Contrary to this, in FIG. 16, since light emitted from the side faces of the LED elements $D_{22}$ and $D_{23}$ is subjected to the phosphor particles P20, the length of optical path of the phosphor particles P10 is shortened, so that the light emitted from the side faces of the LED elements $D_{22}$ and $D_{23}$ is white with no yellow-tint.

A method for forming the phosphor layers P1 and P2 will be explained below.

First, a phosphor layer P2 including phosphor particles P20 is entirely coated on a semiconductor light-emitting device including a semiconductor body 1 formed by LED elements $D_{22}$ and $D_{23}$ bonded onto a support body 2.

Next, the upper portion of the phosphor layer P2 is removed to expose the upper faces of the LED elements $D_{22}$ and $D_{23}$.

Finally, a phosphor layer P1 including the phosphor particles P10 is entirely coated on the LED elements $D_{22}$ and $D_{23}$ and the phosphor layer P2.

Note that the modification of FIG. 16 can also be applied to the embodiments of FIGS. 10, 12 and 15.

In the above-described embodiments, the LED elements are square or rectangular viewed from the top; however, the LED elements can be triangular or hexagonal viewed from the top, so that the LED elements can be in close proximity to each other.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A semiconductor light-emitting device comprising:
   a semiconductor body including light-emitting elements arranged in a matrix; and
   a support body adapted to support said semiconductor body,
   wherein said semiconductor body further includes a plurality of optical shield layers each provided at one of a first side face of a first one of said light-emitting elements and a second side face of a second one of said light-emitting elements opposing the first side face of said first light-emitting element,
   wherein each of said light-emitting elements comprises:
      a first semiconductor layer of a first conductivity type;
      a second semiconductor layer of a second conductivity type opposite to said first conductivity type; and
      an active semiconductor layer sandwiched by said first and second semiconductor layers,
   wherein said support body comprises:
      a support substrate;
      first wiring layers provided on said support substrate, each of said first wiring layers being electrically connected to the second semiconductor layer of one of said light-emitting elements; and
      a second wiring layer provided on said first wiring layers via a second insulating layer, said second wiring layer being electrically connected to the first semiconductor layer of one of said light-emitting elements, and
   wherein each of said optical shield layers is conductive and electrically connected between the first semiconductor layer of one of said light-emitting elements and said second wiring layer.

2. The semiconductor light-emitting device as set forth in claim 1, wherein said semiconductor body further includes a plurality of first insulating layers each provided between one of said light-emitting elements and one of said optical shield layers, said optical shield layers being electrically isolated from said light-emitting elements.

3. The semiconductor light-emitting device as set forth in claim 1, wherein each of said light-emitting elements is mesa-shaped, so that a distance between said first and second side faces is gradually decreased toward said support body.

4. The semiconductor light-emitting device as set forth in claim 1, wherein each of said light-emitting elements is reversely mesa-shaped, so that a distance between said first and second side faces is gradually increased toward said support body.

5. The semiconductor light-emitting device as set forth in claim 1, wherein said semiconductor body further includes:
   a first phosphor layer including first phosphor particles provided between said light-emitting elements on said support body; and
   a second phosphor layer including second phosphor particles different from said first phosphor particles on said light-emitting elements and said first phosphor layer.

6. The semiconductor light-emitting device as set forth in claim 1, wherein said optical shield layers are reflective.

7. The semiconductor light-emitting device as set forth in claim 1, wherein said optical shield layers are absorptive.

* * * * *